United States Patent [19]

Aubert

[11] Patent Number: 5,332,971
[45] Date of Patent: Jul. 26, 1994

[54] PERMANENT MAGNET FOR NUCLEAR MAGNETIC RESONANCE IMAGING EQUIPMENT

[75] Inventor: Guy Aubert, Grenoble, France

[73] Assignee: Universite Joseph Fourier, Grenoble Cedex, France

[21] Appl. No.: 961,699

[22] PCT Filed: Jul. 25, 1991

[86] PCT No.: PCT/FR91/00617

§ 371 Date: Mar. 26, 1993

§ 102(e) Date: Mar. 26, 1993

[87] PCT Pub. No.: WO92/02827

PCT Pub. Date: Feb. 20, 1992

[30] Foreign Application Priority Data

Jul. 30, 1990 [FR] France .................. 90 09698

[51] Int. Cl.$^5$ .................................. G01R 33/20
[52] U.S. Cl. ............................... 324/319; 324/318; 324/302; 324/306
[58] Field of Search .............. 324/319, 318, 322, 300, 324/320; 335/306, 322

[56] References Cited

U.S. PATENT DOCUMENTS

| | | | |
|---|---|---|---|
| 4,538,130 | 8/1985 | Gluckstern et al. | 324/319 |
| 4,580,098 | 5/1986 | Gluckstern et al. | 335/306 |
| 4,829,277 | 5/1989 | Stahura et al. | 335/306 |
| 4,893,103 | 1/1990 | Leupold | 335/306 |
| 4,990,874 | 2/1991 | Aubert | 324/318 |
| 4,994,778 | 2/1991 | Leupold | 335/306 |
| 4,998,084 | 3/1991 | Alff | 335/306 |
| 4,999,600 | 3/1991 | Aubert | 335/306 |
| 5,099,217 | 3/1992 | Leupold | 335/306 |
| 5,103,200 | 4/1992 | Leupold | 335/306 |
| 5,134,374 | 7/1992 | Breneman et al. | 324/319 |
| 5,148,138 | 9/1992 | Miyata | 335/302 |
| 5,194,810 | 3/1993 | Breneman et al. | 324/319 |

Primary Examiner—Michael J. Tokar
Assistant Examiner—Raymond Y. Mah
Attorney, Agent, or Firm—Kerkam, Stowell, Kondracki & Clarke

[57] ABSTRACT

A permanent magnet for nuclear magnetic resonance imaging that provides an intense and highly homogeneous magnetic magnetic field is disclosed. The magnet is made up of a set of rings having two sub-sets of rings of permanently magnetized polygonal blocks, wherein the rings of a sub-set of rings are substantially concentric. In addition, the rings of the two sub-sets are complementary in terms of magnetization. Each ring of a sub-set is separated from its complementary ring by a space that is substantially the same for all pairs of complementary rings. The rings have a regular polygonal structure and are made up of blocks that also have regular polygonal shapes.

10 Claims, 5 Drawing Sheets

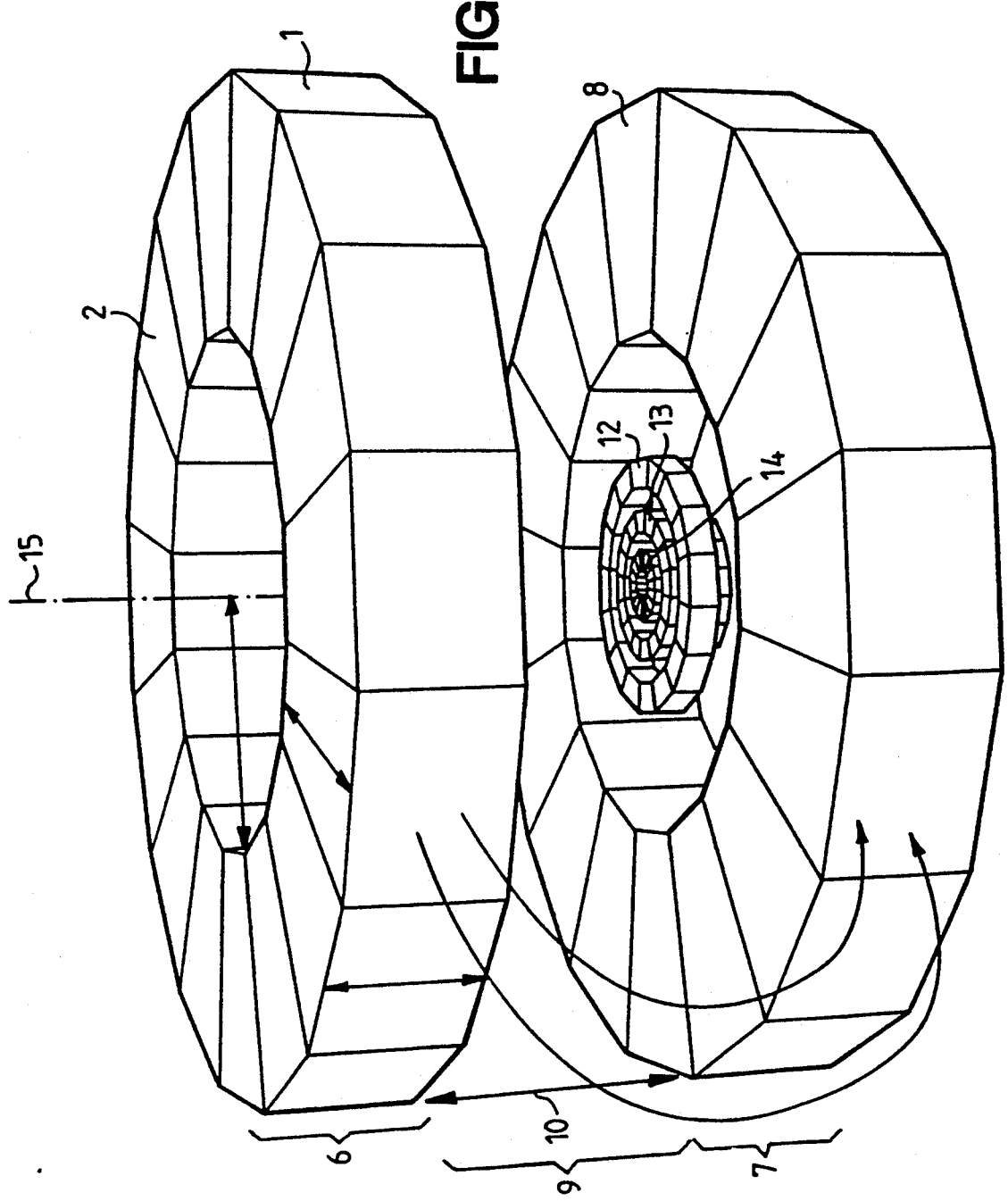

PERMANENT MAGNET FOR NUCLEAR MAGNETIC RESONANCE IMAGING EQUIPMENT

FIELD OF THE INVENTION

The present invention relates to a permanent magnet for nuclear magnetic resonance (NMR) imaging equipment. Specifically, magnet in question is a magnet that is used in equipment such as this to produce a homogeneous and intense magnetic field in a zone of interest. In the medical field, a patient is placed in this zone of interest. The invention can be applied to other fields, notably to industrial controls. It is aimed at producing a so-called transversal field.

BACKGROUND OF THE INVENTION

There are known permanent magnet structures, notably those of the so called plate-magnet type. Structures such as these are described, for example, in the European patent application No. EP-A-0 170 318. Or, again, structures such as these are described in the U.S. Pat. Nos. 4,672,346; 4,679,022 and 4,818,966. Other types of permanent magnet structures are also already known: these are notably a spherical permanent magnet with equatorial access as described in the French patent application No. 2 605 452.

The drawback of the so-called plate-magnet structures lies in the closing of the magnetic field lines. Indeed, to put it in the simple way, in a plate-magnet structure, the transverse field is produced in an air gap located between two plates of permanently magnetized material. The southern face of one plate faces the northern face of the other plate on either side of the gap. The closing of the magnetic field lines is therefore organized between the faces that are furthest away from the two plates. To avoid detrimental effects on the value of the field produced in the air gap by the existence of this other air gap for the closing of the field lines, it is the usual practice to position, between these two distant faces, closing structures made of a magnetizable magnetic material, typically soft iron. These soft iron structures have several drawbacks. Firstly, although the cost of soft iron is low, it nevertheless adds to the price of the magnet. Furthermore, these soft iron structures take up space and limit the points of access to the useful zone of the air. The ideal solution would be to close the field lines everywhere. However, in this case, it is no longer possible to enter the zone of interest of the magnet.

Furthermore, the approaches thus conceived firstly do not lead to great homogeneity of the intense magnetic field in the zone of interest and, secondly, are most likely to give rise to eddy currents during the sequences for the excitation and measurement of the NMR signal used in the imaging methods. The homogeneity is not high for it can only be empirical. Indeed, these soft iron structures, which are also used to hold the magnetic plates, have shapes dictated by considerations of mechanics that do not lend themselves to the preparation of precise models of their contribution to the magnetic field. It is possible to use only techniques of computation by finite elements which do not have sufficient precision with respect to the homogeneity of the field required by the NMR.

The fact remains, therefore, that it is necessary to carry out the empirical validation of the actually created field. This empirical validation makes it necessary to conceive of the positioning of soft iron parts at certain particularly appropriate places so as to measure the effects of this positioning and carry out the consequent modification until, little by little, the requisite modification is achieved. This empirical technique is not an industrial-scale technique: great skills are required to make only one copy, and the technique is not easily reproducible.

With regard to eddy currents, the pulsed characteristics of the gradients of the additional magnetic field, applied during the sequences for the excitation and measurement of the NMR signal in the examinations, run counter to such an approach because soft iron is conductive. In the invention, as shall be seen further below, a structure without soft iron is used, implementing solely blocks of magnets which, furthermore, can be computed analytically. If these blocks of magnets are ferrite-based blocks, they are themselves insulators and are therefore not the site of eddy currents.

In the French patent application relating to the spherical permanent magnet with equatorial access referred to here above, a symmetrical structure was made, based on rings with a generally hemispherical shape producing a transversal field. The drawback of this structure lay in the fact that, one the one hand, the holding and adjusting of the spherical rings with respect to one another is not a simple matter in mechanical terms. And, above all, secondly, the zone of interest in which the field is homogeneous is far greater than the dimension of the point of access to this zone. In other words, the two hollow hemispherical structures give a large zone of interest with great homogeneity in their interior.

By contrast, the access to the interior is narrow; it is as if it were assumed that the spacing between these structures were not enough to enable sliding into them. In practice, the medical machines made with this invention are ill-suited to the examination of adult patients. Furthermore, the magnetization of the magnetic blocks used to make the rings of this spherical structure had to have an orientation as a function of the position of these blocks. This position was referenced on a circle having one of its diameters perpendicular to the plane of the equatorial access to this magnet. This was also true for the value of magnetization of these blocks. This led to difficulties in the making of the blocks.

SUMMARY OF THE INVENTION

In the invention, these drawbacks are overcome by proposing a structure that is far simple than the spherical structure with equatorial access, the zone of interest of which is entirely accessible, this structure furthermore being one that does not require the presence of soft iron to ensure the return of the magnetic field lines. In the approach invented, instead of making magnetized single-block plates with a north pole and a south pole, these plates are replaced by rings that are concentric with one another, wherein the non-uniform distribution of the magnetization is such that it leads, per se, to great homogeneity of the field produced. With the rings, it is possible to create every great homogeneity locally. To this end, blocks are used with shapes, positions and magnetizations computed, firstly, to produce the homogeneity and, secondly, in a preferred embodiment, to obtain easier closing of the field lines.

An object of the invention therefore is a permanent magnet for nuclear magnetic resonance imaging equipment comprising a set of rings of magnetized blocks to produce an intense and homogeneous magnetic field in a region of space, these rings being divided into two sets of complementary rings, characterized in that the the rings of a set are all substantially concentric, each ring of a set being separated from its complementary ring in the other facing set by a height of this region, this height being substantially the same for all the pairs of complementary rings.

BRIEF DESCRIPTION OF THE DRAWINGS

The invention will be understood more clearly from the following description of the accompanying figures. These figures are given purely by way of an indication and in no way restrict the scope of the invention.

DETAILED DESCRIPTION OF THE PREFERRED EMBODIMENTS

As shall be seen hereinafter, the order of homogeneity to be followed by the structures according to the invention must be high. Indeed, the fact of having a large magnetic structure available has the immediate consequence wherein, on a small given dimension in the zone of interest of this magnetic structure, the variations of the field, namely the inhomogeneity, are lower than they would be if the magnetic structure were smaller, and if the result obtained on the same given small dimension were to considered. Thus, in the superconductive, or even resistive, type magnets of the prior art, given the space needed to slide the patient into the machine and to position the various gradient coils and transceiver antenna, the useful internal diameter of the cylindrical magnets is of the order of one meter. Under these conditions, it is enough to achieve an eighth-order homogeneity of the magnetic field (the first non-zero order is the tenth). In the useful thirty centimeters of the zone of interest, these inhomogeneities, to simplify matters, are multiplied by a factor $(0.3/1.00)^{10} = 5.9.10^{-6}$. They are therefore relatively reduced.

By contrast, in structures like that of the invention, where the useful dimension (0.30 m) of the zone of interest is substantially of the same order as the logistical space between the "plates" of magnets, in the range of 0.50 m, the analytical homogeneity should be greater. It is necessary to attain, for example, the fourteenth order. The need to reduce the logistical space to the minimum results from the fact that the volume of magnetic material increases as the cube of this logistical space. In the invention, it is not the logistical space that is increased but, on the contrary, with an approach using a different distribution of the magnetization in the "plates", the order of homogeneity is increased. Thus, magnetic plates are obtained with a volume of material that is comparable to known plate-magnets and, at the same time, has very high homogeneity.

Figure 1A:
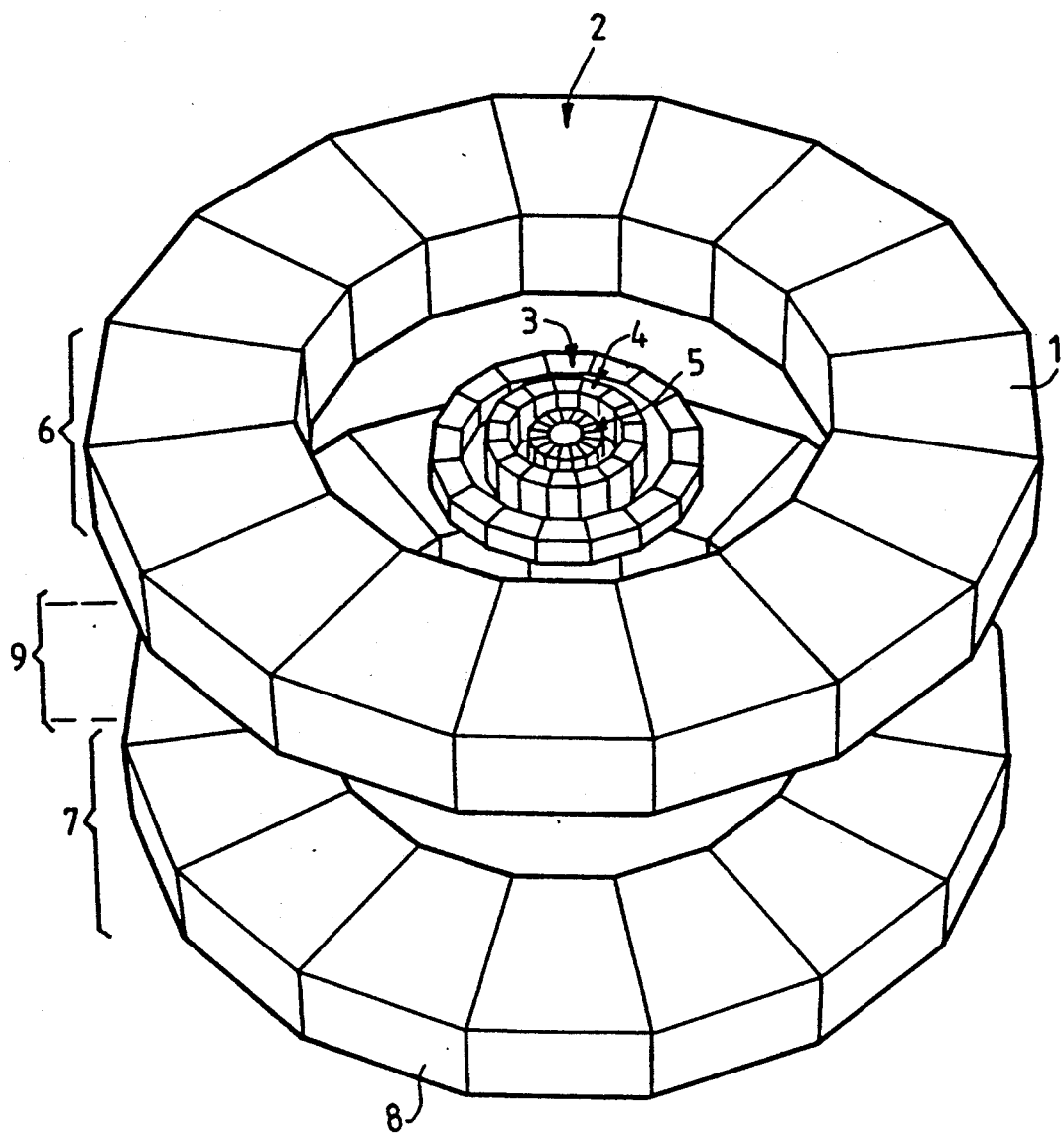
FIGS. 1-a, 1-b, 2 and 3 shows exemplary embodiments of magnets according to the invention.

The same structure, shown in perspective in FIGS. 1a and 1b, respectively in an oblique descending view and substantially in a transverse plane, is capable of giving a 0.2 tesla field in its air gap. It is formed by magnetic blocks such as 1 which, in a preferred example, are made of iron-neodymium-boron (FeNdB). If Br designates the remnant induction inside a saturation magnetized magnetic material such as this, the structure thus produced is such that the value $B_0$ (0.2 tesla) produced is substantially equal to 0.17 Br. Furthermore, no demagnetizing excitation is encountered in the material greater in absolute value than 0.7 times the coercive excitation of this material. There is therefore no demagnetizing effect. In practice, the structure of FIGS. 1a and 1b weights about 3 tonnes.

The permanent magnet thus described comprises a set of rings, for example the rings 2, 3, 4, 5. These rings are divided into two sets, 6 and 7 respectively, of complementary rings. For example, the ring 8 in the set 7 is complementary to the ring 2 in the set 6. The rings of one and the same set, for example the rings 2, 3, 4 and 5 in the set 6, are all substantially concentric. This means, firstly, that the rings have a same axis 15 of revolution and, secondly, that they are entirely capable of being imbricated with one another. In practice, this means that the biggest ring of a set, in this case the ring 2, can contain all the other rings of the same set. Furthermore, in the invention each ring of a set is separate from its complementary ring in the other set, for example the rings 2 and 8, by a same height 10 of the region 9 of the space between its ring, where there prevails the intense and homogeneous magnetic field.

Figure 4:
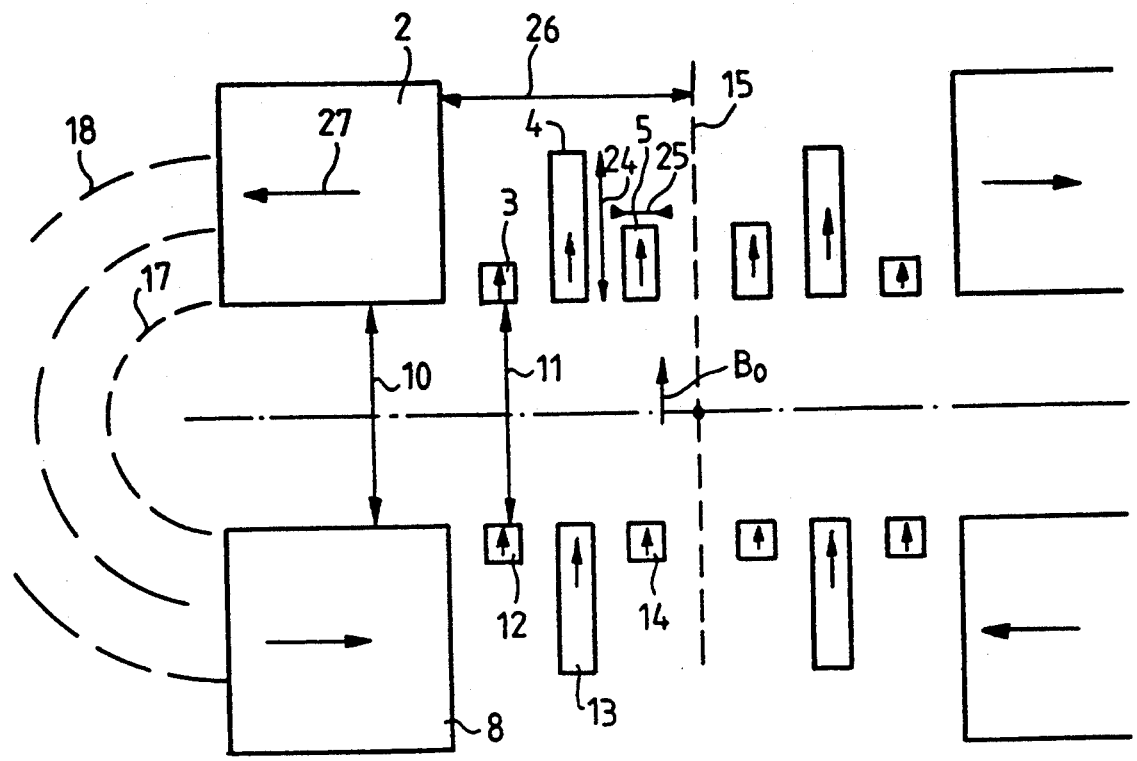
FIGS. 4, 5 and 6 gives dimensions and spacings showing, for the previous examples, the way in which to distribute the magnetic blocks in the rings.

The height that separates two complementary rings is substantially the same for all the pairs of complementary rings of the sets of rings of the magnet. These particular characteristics of dimensions will, in any case, be seen more clearly in FIG. 4. This figure is a sectional view, along a plant that radially sections all the rings of FIG. 1a or FIG. 1b.

The height is the height 10 which separates the ring 2 from the ring 8. This height 10 is substantially equal to the height 11 which separates the ring 3 from the ring 12, and this is repeated successively for the rings 4 and 5 and their respectively complementary rings 13 and 14. FIG. 1b shows the same elements as well as the axis of revolution 15. The height measures the distance between the faces that are facing the air gap.

Since the filing, on 14th Dec. 1984, of the French patent application No. 84 19191, there is a known way of expressing, in terms of relative value, the value of the induced magnetic field, in a system of polar coordinates standardized by a radius $r_0$ defining the boundaries of the useful volume in which the requisite homogeneity is obtained. This expression can be written as follows:

$$\frac{B_z}{B_0} = 1 + \sum_{n=1}^{\infty} \left(\frac{r}{r_0}\right)^n \cdot H_n \cdot P_n (\cos \Theta) +$$

$$\sum_{m=1}^{n} (I_n^m \cos m\Phi + J_n^m \sin m\Phi) P_n^m (\cos \Theta)$$

In this expression, the polynomials $P_n (\cos \theta)$ and $p_m^m (\cos \theta)$ are the Legendre polynomials of the first and second types respectively. The difference expressing the inhomogeneity, with respect to the value 1 for $B_z/B_0$, is given by the value of the coefficients $H_n$, $I_n^m$ and $J_n^m$. The field $B_z$ at a distance r from the center of the zone of interest will be all the more homogeneous as these coefficients are zero up to high values of n. It is then said that the field is homogeneous to the nth order, if all the terms of the series, of orders smaller than or equal to n, are zero. n designates the order of homogeneity.

The structure presented is a structure homogeneous to the fourteenth order. It procures a homogeneity greater than 1 ppm in a useful volume, the height of which is substantially greater than half of the height 10.

Having a homogeneity of over 1 ppm means that, at all the places of the useful region of the aperture 6, the value of the field does not move away, relatively, by more than one millionth from the value of 0.2 tesla.

The field $B_0$ created has a transverse orientation: it is colinear with the axis 15. In the approach shown, the magnetization in the rings 3, 4 and 5 is also transverse. By contrast, the magnetization in the ring 2 is radial. In the rings 12, 13 and 14, the magnetization is also transverse. Moreover, it is oriented in the same direction as the magnetization in the corresponding rings, 3, 4 and 5 respectively. However, in the ring 8, the magnetization is radial but centripetal, whereas it is radial and centrifugal in the ring 2. The structure of the FIGS. 1-a, 1-b and 4 is therefore a structure with composite magnetization.

These structures with composite magnetization are promising in that the closing of the field lines such as 17 and 18 is achieved done to the nearest possible extent. In particular, the field created outside the structure of FIG. 4 decreases very swiftly with distance therefrom. In other words, it is possible enable wearers of cardiac stimulation devices to approach this magnet without fearing that their stimulators will be turned off because of the presence of an excessively great magnetic leakage field. The composite structure thus presented is a preferred approach according to the invention. It has thus been possible to compute that, at a distance of three meters from the magnet, the field to be undergone is in the range of two Gauss, i.e. it is a field that is substantially only four times the earth's magnetic field.

Figure 2:
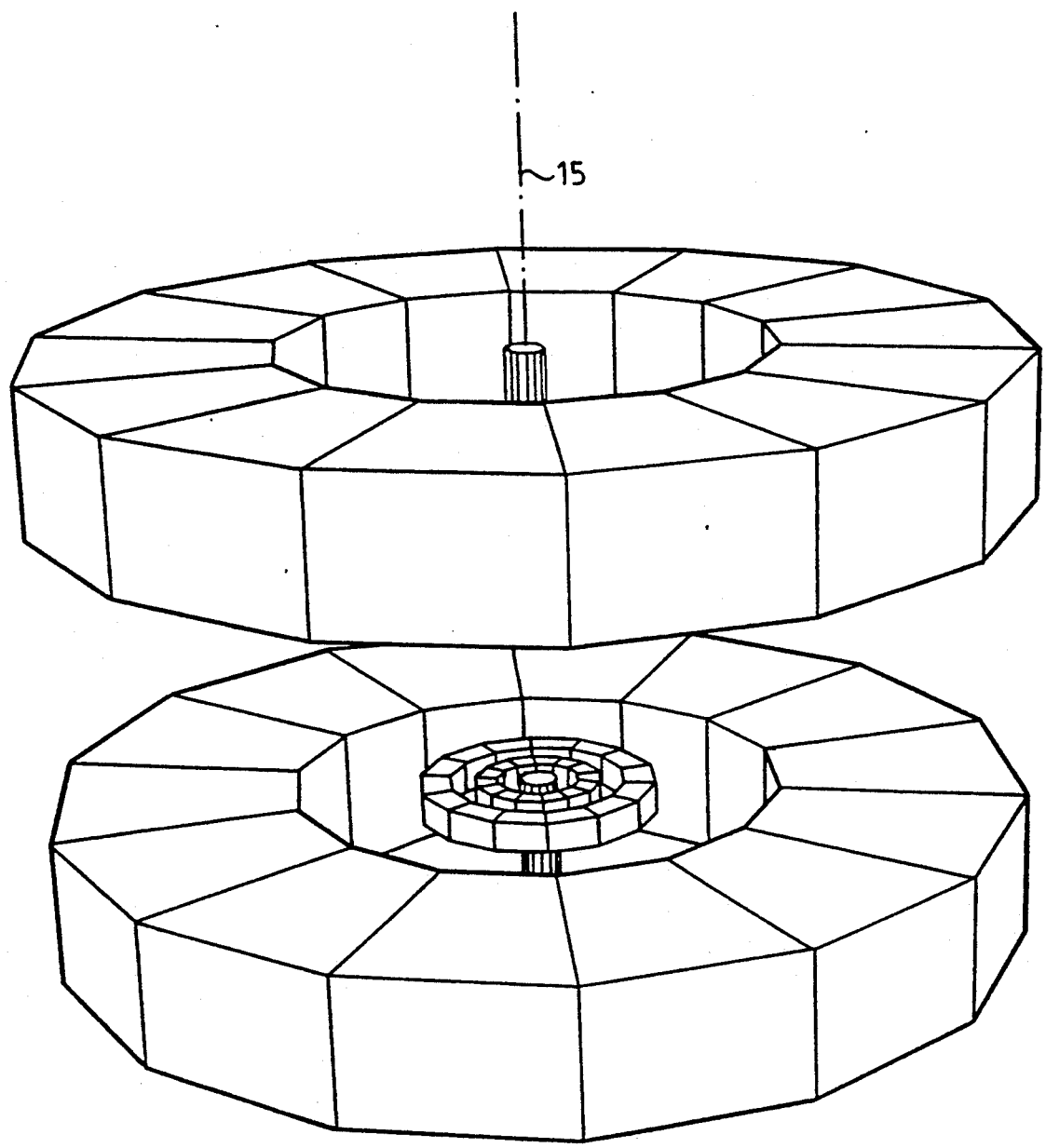
Figure 3:
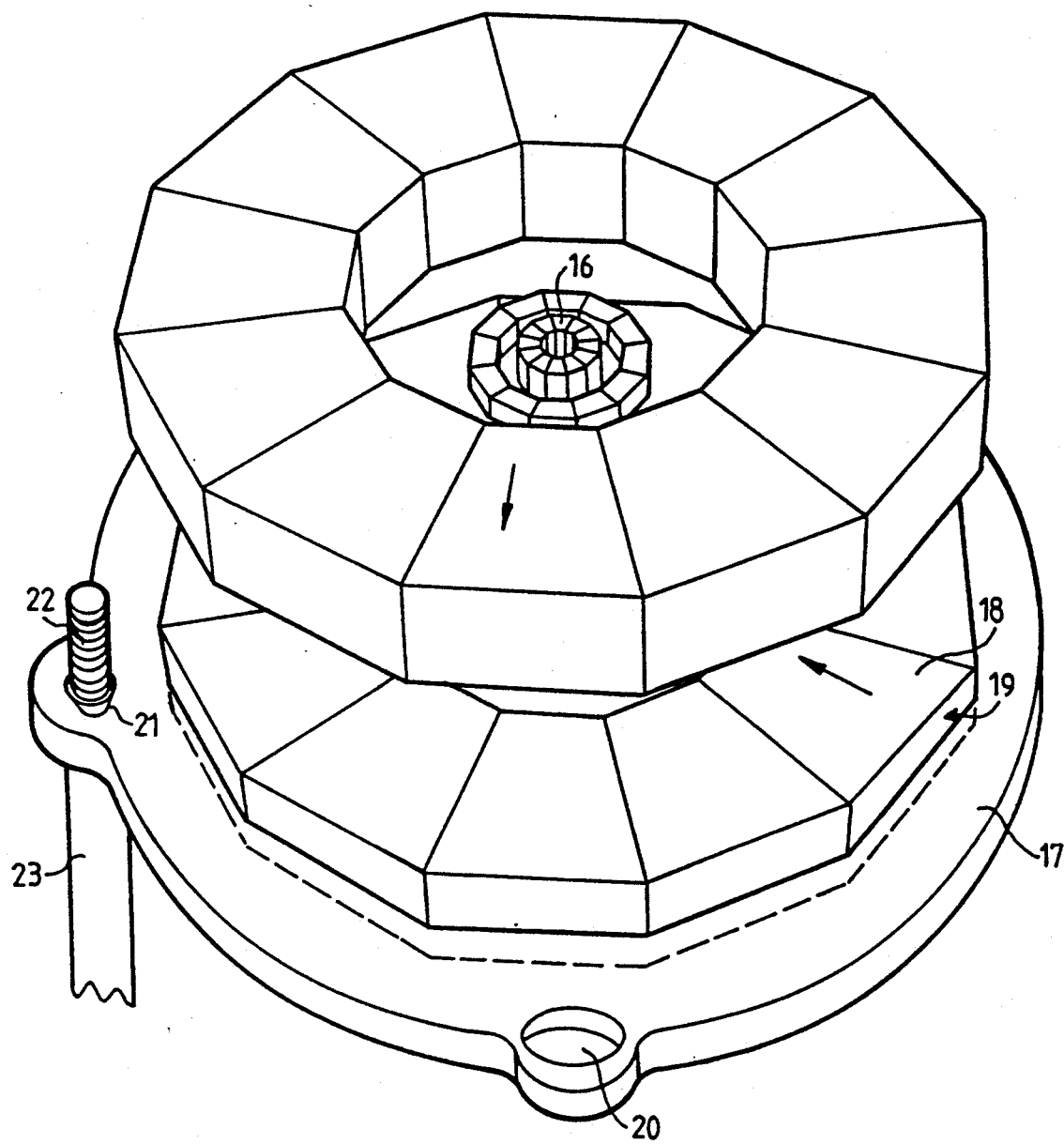
Figure 5:
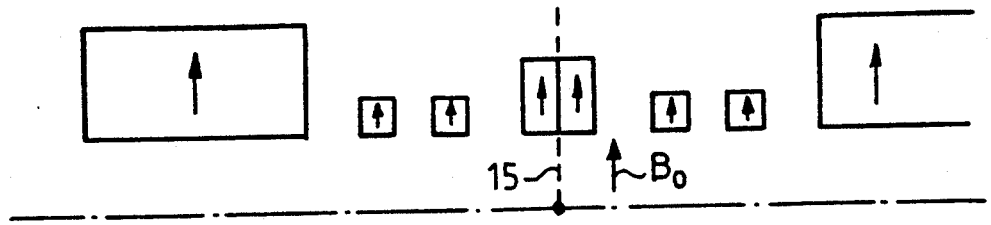
Figure 6:
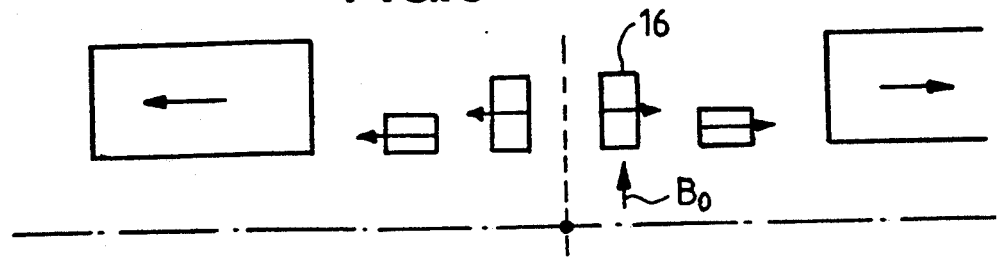

FIGS. 2 and 3, in association with the corresponding FIGS. 5 and 7 seen in a sectional view, show two other exemplary embodiments of a magnet structure according to the invention. In the structure of FIG. 2, the magnet shown also has four rings, but offers the particular advantage of having a central ring which completely blocks the hole at the place through which the axis 15 passes. The structure of FIG. 3 is, by contrast, a structure with only three rings, the central ring 16 of which is itself also hollow.

As shall be explained hereinafter, as a function of the expression given here above, the consequence of the fact that this structure has only three rings is that it produces a less homogeneous magnetic field. However, it is less demanding in terms of quantity of magnetic material. The structure of FIG. 2 is a structure in which in which all the magnetic blocks have a transverse magnetization, somewhat in the manner of what is known in the plate-magnets of the prior art. However, contrary to what was known in the prior art, the homogeneity of the field $B_0$ is obtained in the space 9 by particular dimensions of the different rings. It is not produced by a uniform magnetization of the pole pieces and of the pieces for closing the field which would be made of soft iron. In the structure of FIG. 3, the orientations are radial, centrifugal on the part shown. They would be centripetal on the complementary part which is not shown. Here too, the homogeneity is achieved by the different sizes of the blocks.

FIG. 3 furthermore shows a belt 17 that is made of a non-magnetic material and therefore does not deform the homogeneity of the magnetic field produced. The belt 17, which may be made of a light alloy, wood, plastic or concrete, preferably then reinforced with glass fibres, is used to fasten all the blocks such as the block 18 of the ring 19. The radial magnetization is also shown in the block 18. The belt 17 is furthermore provided with oblong holes such as 20 and 21. These holes enable the fitting together of a threaded head such as 22 and a holding part 23. In the position where the useful zone 9 of the magnet is presented horizontally, the rings are substantially parallel to the ground. The parts 23 relating to the lower rings of the magnet are fixed to the ground. Complementary parts, for the upper complementary rings, may be fixed to the ceiling of the room in which the structure is installed. The oblong shape of the holes 20 and 21 enables the rings such as 19 to be shifted slightly in translation or rotation, but not in any direction, in their planes so as to give degrees of freedom to the motions of these rings, in order to provide for the fine adjusting of the homogeneity if necessary. Furthermore, the threaded heads 22 may be provided, at their lower part, with threaded nuts on which the belt 17 lies. These nuts are used to adjust the parallelism of the rings.

With respect to the external ring, the belt 17 has to be dimensioned to withstand major magnetic forces which, furthermore, can be easily computed. With respect to the small concentric rings internal to the big rings, the forces are smaller. In order to hold these internal rings, rather than making independent rings it is possible, each time, to embed all these rings, for example 12 to 14 and 3 to 5, in a mould, respectively in a coating material, for example one made of polymerizable resin. These sets too may be maintained by independent and adjustable systems. The spaces between the rings enable easy logistical access.

The following table gives the number of rings needed for the given orders of homogeneity $2p_0$, the order of the first non-zero term being equal to $2(p_0+1)$, as well as, in each ring, which is a regular polygon, the minimum number of sides of the polygon that this ring should comprise so that the desired homogeneity is obtained.

| $2p_0$ | $n_c$ | central hole | $n_b$ |
|---|---|---|---|
| 2 | 1 | No | 4 |
| 4 | 2 | Yes | 6 |
| 6 | 2 | No | 8 |
| 8 | 3 | Yes | 10 |
| 10 | 3 | No | 12 |
| 12 | 4 | Yes | 14 |
| 14 | 4 | No | 16 |

The first column gives the order of homogeneity. The second column indicates the minimum number of rings needed to attain this homogeneity. The fourth column gives the minimum number of sides per polygonal ring to attain this homogeneity. The remnant magnetizations in the blocks may be the same. The sizes of the blocks are given here below, for an exemplary application of the analytical expression given here above.

In one example, corresponding to FIG. 1, it is thus been possible to determine the heights 24, the thicknesses 25 and the internal diameter 26 of each of the rings of the "plate". These dimensions relating to the half-aperture (the height 10 is therefore equal to 2) are given in the following table:

|  | Ring 2 | Ring 3 | Ring 4 | Ring 5 |
|---|---|---|---|---|
| Height 24 | 0.657 | 0.187 | 0.298 | 0.270 |
| Thickness 25 | 1.288 | 0.200 | 1.150 | 0.135 |
| Internal radius 26 | 1.709 | 0.685 | 0.372 | 0.111 |

The intensity of the magnetization 27 is the same in all the blocks. These results are deduced from the teachings of the above-mentioned patent application. It has been realized that, since the assessment was made by computation of the theoretically cylindrical rings, and since these rings were made in the polygonal form of successions of blocks attached to each other, this approximation was itself necessarily a source of inhomogeneities. However, if the number of blocks chosen to simulate a cylindrical ring is sufficient, then the theoretically expected results are actually obtained on the practical plane. This order of homogeneity is related to the number of rings in such a way that the number of blocks is also related to the number of rings as indicated in the above table.

It is nevertheless possible, by bringing into play the heights, thicknesses and internal diameters of the blocks of a ring, to obtain, by the application of the above analytical breakdown, a magnet of the requisite quality. The magnet described is an optimal magnet, i.e. one which, at each time, uses magnetic materials magnetized to saturation to the maximum of their possibility. In the proposed embodiment, the blocks have a trapezoidal shape. Their small side is pointed towards the center of the ring and their large side is pointed towards the exterior of the ring. It is however possible to replace these trapezoidal blocks by rectangular parallelepiped blocks which are easier to manufacture, but a weaker magnetic field would be obtained for the same overall dimensions.

In the rings, the complementary blocks naturally possess complementary magnetizations. In practice, to simplify the design and the construction, the rings are made for each of the two sets, out of materials of a same nature and for each ring with magnetic blocks of the same shapes. It would be possible, however, to arrive at similar results with blocks of different shapes and with different magnetizations.

The making of the blocks with given magnetizations can be done in different ways. It is possible, for example, to magnetize blocks such as these to saturation and reduce their remnant magnetization by going through the hysteresis cycle of their magnetization curve in such a way that this remnant magnetization follows a reverse straight line different from the one coming from the saturation. In a preferred way, blocks made of a composite material as described in the French patent No. 2 574 980 will be built.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as defined in the following claims.

I claim:

1. A permanent magnet for nuclear magnetic resonance imaging equipment, comprising:
   a set of rings comprising two sub-sets of rings of magnetized blocks for producing an intense and homogeneous magnetic field in a region of space, the rings within each sub-set being substantially concentric the rings in each subset being complementary in terms of magnetization, each ring of a sub-set being separated from its complementary ring in a facing sub-set by a height of this region, said height being substantially the same for all pairs of complementary rings, wherein the rings have a regular polygonal structure and are comprised of blocks, the number of blocks in each ring being substantially greater than or equal to four times the number of rings in a subset of rings.

2. A magnet according to claim 1, wherein internal rings of each of the sub-sets of rings are provided with blocks in which the orientation of the magnetization is transverse with respect to the planes of the internal rings.

3. A Magnet according to claim 1, wherein internal rings of each of the sub-sets of rings are each provided with a central hole.

4. A magnet according to claim 1, producing a homogeneous magnetic field, wherein an analytical expression of said homogeneous magnetic field comprises no term of an order equal to or smaller than $2p_0$, the rings having a regular polygonal structure formed by sets of blocks comprising at least $2(p_0+1)$ blocks.

5. A permanent magnet for nuclear magnetic resonance imaging equipment, comprising:
   a set of rings comprising two sub-sets of rings of permanently magnetized blocks for producing an intense and homogeneous magnetic field in a region of space, the rings being complementary in terms of magnetization, the rings within each sub-set of rings being substantially concentric, each ring of a sub-set of rings being separated from its complementary ring in a facing sub-set by a height of this region, said height being substantially the same for all pairs of complementary rings, rings of successively greater diameter in each of the sub-sets of rings being provided with blocks in which the orientation of magnetization is radial with respect to the rings.

6. A magnet according to claim 5, wherein magnetic fields produced by the blocks of a ring are parallel to the direction of magnetic fields produced by directly facing blocks of its complementary ring.

7. A magnet according to claim 1, wherein magnetic fields produced by the blocks of a ring are parallel to the direction of magnetic fields produced by directly facing blocks of its complementary ring.

8. A magnet according to claim 5, wherein internal rings of each of the sub-sets of rings are provided with blocks in which the orientation of the magnetization is transverse with respect to the planes of the internal rings.

9. A magnet according to claim 5, wherein internal rings of each of the sub-sets of rings are each provided with a central hole.

10. A magnet according to claim 5, producing a homogeneous magnetic field, wherein an analytical expression of said homogeneous magnetic field comprises no term of an order equal to or smaller than $2p_0$, the rings having a regular polygonal structure formed by sets of blocks comprising at least $2(p_0+1)$ blocks.

* * * * *